(12) United States Patent
Gisin

(10) Patent No.: US 10,712,398 B1
(45) Date of Patent: Jul. 14, 2020

(54) MEASURING COMPLEX PCB-BASED INTERCONNECTS IN A PRODUCTION ENVIRONMENT

(71) Applicant: Multek Technologies Limited

(72) Inventor: Franz Gisin, San Jose, CA (US)

(73) Assignee: Multek Technologies Limited, San Jose, CA (US)

( * ) Notice: Subject to any disclaimer, the term of this patent is extended or adjusted under 35 U.S.C. 154(b) by 378 days.

(21) Appl. No.: 15/629,270

(22) Filed: Jun. 21, 2017

Related U.S. Application Data

(60) Provisional application No. 62/352,884, filed on Jun. 21, 2016.

(51) Int. Cl.
   *G01R 31/67* (2020.01)
   *G01R 31/28* (2006.01)

(52) U.S. Cl.
   CPC ......... *G01R 31/67* (2020.01); *G01R 31/2813* (2013.01)

(58) Field of Classification Search
   CPC .................. G01R 31/041; G01R 31/2813
   See application file for complete search history.

(56) References Cited

U.S. PATENT DOCUMENTS

| | | |
|---|---|---|
| 4,069,497 A | 1/1978 | Steidlitz |
| 4,338,149 A | 7/1982 | Quaschner |
| 4,630,172 A | 12/1986 | Stenerson |

(Continued)

FOREIGN PATENT DOCUMENTS

| | | |
|---|---|---|
| CN | 1150251 A | 5/1997 |
| CN | 2457613 Y | 10/2001 |

(Continued)

OTHER PUBLICATIONS

Non-Final office Action dated Nov. 1, 2017, U.S. Appl. No. 15/367,679, filed Dec. 2, 2016, applicant: Joan K. Vrtis, 28 pages.

(Continued)

*Primary Examiner* — Gregory J Toatley, Jr.
*Assistant Examiner* — Lynda Dinh
(74) *Attorney, Agent, or Firm* — Carlson, Caspers, Vandenburgh & Lindquist, P.A.

(57) ABSTRACT

A measuring system and method is configured to analyze numerous different types of interconnects having varying degrees of complexity. The measuring system and method characterizes an interconnect to be tested by a predefined reflection coefficient signature. Each specific interconnect is predefined by a reflection coefficient signature that is unique to that specific interconnect. Once the reflection coefficient signature is defined, a corresponding reflection envelope is defined which defines boundary limits about the reflection coefficient signature. Subsequent testing of the specific interconnect results in a measured reflection coefficient curve, which is compared to the corresponding reflection envelope. The specific interconnect under test is considered acceptable if the values of the measured reflection coefficient curve do not fall outside the reflection envelope. If one or more values of the measured reflection coefficient curve fall outside the reflection envelope, then the specific interconnect under test fails the test.

20 Claims, 8 Drawing Sheets

(56) References Cited

U.S. PATENT DOCUMENTS

| | | | |
|---|---|---|---|
| 4,704,573 A * | 11/1987 | Turner, Jr. | G01R 27/06 324/646 |
| 4,712,160 A | 12/1987 | Sato et al. | |
| 4,899,256 A | 2/1990 | Sawy-Tin | |
| 5,004,639 A | 4/1991 | Desai | |
| 5,062,201 A | 11/1991 | Long, Jr. | |
| 5,101,322 A | 3/1992 | Ghaem et al. | |
| 5,116,440 A | 5/1992 | Takeguchi | |
| 5,121,297 A | 6/1992 | Haas | |
| 5,159,750 A | 11/1992 | Dutta | |
| 5,175,047 A | 12/1992 | McKenney | |
| 5,206,463 A | 4/1993 | Demaso | |
| 5,235,491 A | 8/1993 | Weiss | |
| 5,272,599 A | 12/1993 | Koenen | |
| 5,295,044 A | 3/1994 | Araki et al. | |
| 5,365,403 A | 11/1994 | Vinciarelli et al. | |
| 5,459,639 A | 10/1995 | Izumi | |
| 5,536,677 A | 7/1996 | Hutbacher | |
| 5,560,531 A | 10/1996 | Ruszowski | |
| 5,838,554 A | 11/1998 | Lanni | |
| 5,872,051 A | 2/1999 | Fallon et al. | |
| 5,873,512 A | 2/1999 | Bielick et al. | |
| 5,920,458 A | 7/1999 | Azar | |
| 5,933,324 A | 8/1999 | Barrett | |
| 6,035,524 A | 3/2000 | Suppa | |
| 6,189,771 B1 | 2/2001 | Maeda et al. | |
| 6,243,269 B1 | 6/2001 | Dibene, II et al. | |
| 6,245,595 B1 | 6/2001 | Nguyen | |
| 6,272,015 B1 | 8/2001 | Mangtani | |
| 6,282,092 B1 | 8/2001 | Okamoto et al. | |
| 6,311,139 B1 | 10/2001 | Kuroda et al. | |
| 6,369,328 B1 | 4/2002 | Munakata | |
| 6,541,712 B1 | 4/2003 | Gately | |
| 6,549,409 B1 | 4/2003 | Saxelby et al. | |
| 6,775,162 B2 | 8/2004 | Mihai et al. | |
| 6,795,315 B1 | 9/2004 | Wu et al. | |
| 7,208,833 B2 | 4/2007 | Nobori et al. | |
| 7,281,328 B2 | 10/2007 | Lee | |
| 7,576,288 B2 | 8/2009 | Kondo | |
| 8,042,445 B2 | 10/2011 | Lin | |
| 8,222,537 B2 | 7/2012 | Dudnikov, Jr. | |
| 8,278,565 B2 | 10/2012 | Honjo | |
| 8,330,051 B2 | 12/2012 | Huang | |
| 8,558,116 B2 | 10/2013 | Lee | |
| 8,882,954 B2 | 11/2014 | Lee | |
| 9,323,877 B2 * | 4/2016 | Ng | H01Q 1/34 |
| 9,549,468 B1 | 1/2017 | Tsai et al. | |
| 9,554,465 B1 | 1/2017 | Liu | |
| 2001/0010303 A1 | 8/2001 | Caron | |
| 2001/0018263 A1 | 8/2001 | Ochiai et al. | |
| 2001/0045297 A1 | 11/2001 | Miller et al. | |
| 2001/0055069 A1 | 12/2001 | Hudson | |
| 2002/0008963 A1 | 1/2002 | DiBene, II et al. | |
| 2002/0092160 A1 | 7/2002 | McCullough | |
| 2003/0020905 A1 | 1/2003 | Savareigo | |
| 2003/0110610 A1 | 6/2003 | Duquette | |
| 2004/0122606 A1 | 6/2004 | Cohen et al. | |
| 2004/0130730 A1 | 7/2004 | Cantin | |
| 2004/0144527 A1 | 7/2004 | Yang et al. | |
| 2005/0079289 A1 | 4/2005 | Farguhar | |
| 2005/0246590 A1 | 11/2005 | Lancaster | |
| 2006/0017936 A1 | 1/2006 | Cantin | |
| 2006/0043567 A1 | 3/2006 | Palanduz | |
| 2006/0196642 A1 | 9/2006 | Gharib | |
| 2006/0254811 A1 | 11/2006 | Kirstein | |
| 2007/0272435 A1 | 11/2007 | Johnson | |
| 2007/0273011 A1 | 11/2007 | Singleton et al. | |
| 2008/0217768 A1 | 9/2008 | Miranda et al. | |
| 2008/0224026 A1 | 11/2008 | Pasternak | |
| 2008/0282540 A1 | 11/2008 | Singleton | |
| 2009/0004438 A1 | 1/2009 | Urakawa | |
| 2009/0014501 A1 | 1/2009 | Nishi et al. | |
| 2009/0265155 A1 | 10/2009 | Yokogawa | |
| 2010/0181104 A1 | 7/2010 | Hotta | |
| 2011/0203889 A1 | 8/2011 | Iwamoto | |
| 2011/0307752 A1 | 12/2011 | Fuji et al. | |
| 2012/0024575 A1 | 2/2012 | Zhang | |
| 2012/0063096 A1 | 3/2012 | Kearney | |
| 2012/0119404 A1 | 5/2012 | Wallace | |
| 2012/0234587 A1 | 9/2012 | Nakamura | |
| 2013/0027867 A1 | 1/2013 | Lauder | |
| 2014/0024147 A1 | 1/2014 | Xie | |
| 2014/0139233 A1 * | 5/2014 | Jeong | G01R 31/11 324/520 |
| 2014/0301053 A1 | 10/2014 | Iida et al. | |
| 2014/0318994 A1 | 10/2014 | Lee | |
| 2015/0014029 A1 | 1/2015 | Iwayama | |
| 2015/0047884 A1 | 2/2015 | Nagaura | |
| 2015/0257278 A1 | 9/2015 | Niskala | |
| 2015/0332563 A1 | 11/2015 | Davis | |
| 2015/0376444 A1 | 12/2015 | Saito | |
| 2016/0013152 A1 | 1/2016 | Yu et al. | |
| 2016/0021762 A1 | 1/2016 | Kallman | |
| 2016/0088729 A1 | 3/2016 | Kobuke | |
| 2019/0029136 A1 | 1/2019 | Bharadwaj | |

FOREIGN PATENT DOCUMENTS

| | | |
|---|---|---|
| CN | 102841224 A | 12/2012 |
| KR | 100891814 | 3/2009 |

OTHER PUBLICATIONS

Non-Final Office Action dated Sep. 4, 2018, U.S. Appl. No. 15/064,437, filed Mar. 8, 2016, applicant: JL Zhou, 14 pages.

"Measuring Parasitic Capacitance and Inductance Using TDR", by David Dascher, Aug. 1996 Hewlett Packard Journal, Article 11, 19 pages.

Final Office Action dated Feb. 28, 2019, U.S. Appl. No. 15/064,437, filed Mar. 8, 2016, applicant: JL Zhou, 22 pages.

Non-Final Office Action, dated Nov. 28, 2017, U.S. Appl. No. 14/995,087, filed Jan. 13, 2016, Applicant: Pui Yin Yu, 11 pages.

Final office action dated Jun. 26, 2019, U.S. Appl. No. 14/536,370, filed Nov. 7, 2014, applicant: Josef Kaiser, 9 pages.

Final office action dated Jul. 26, 2019, U.S. Appl. No. 15/980,096, filed May 15, 2018, applicant: Jesus Tan, 11pages.

* cited by examiner

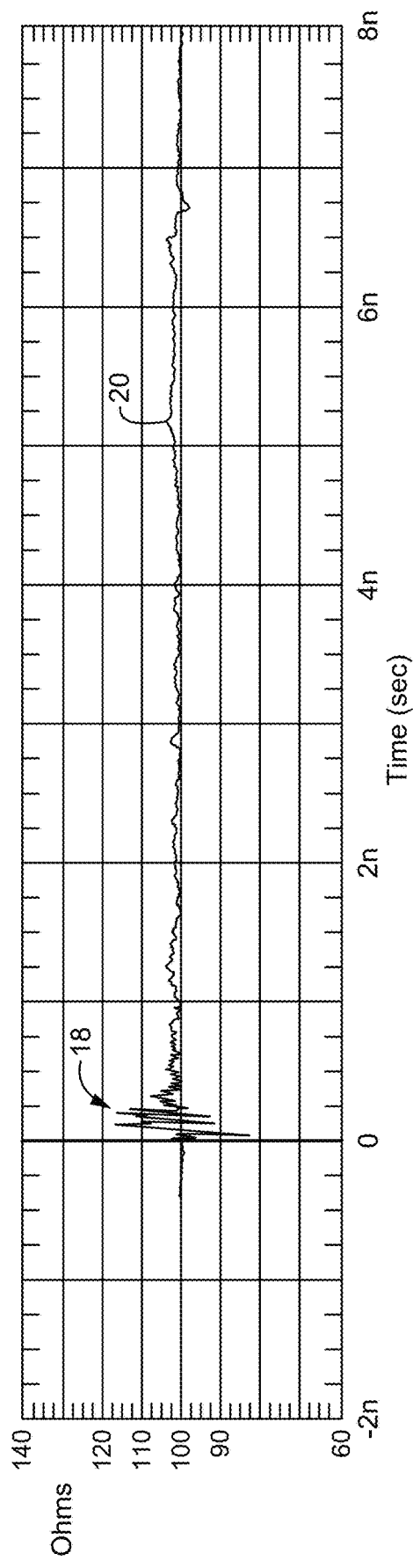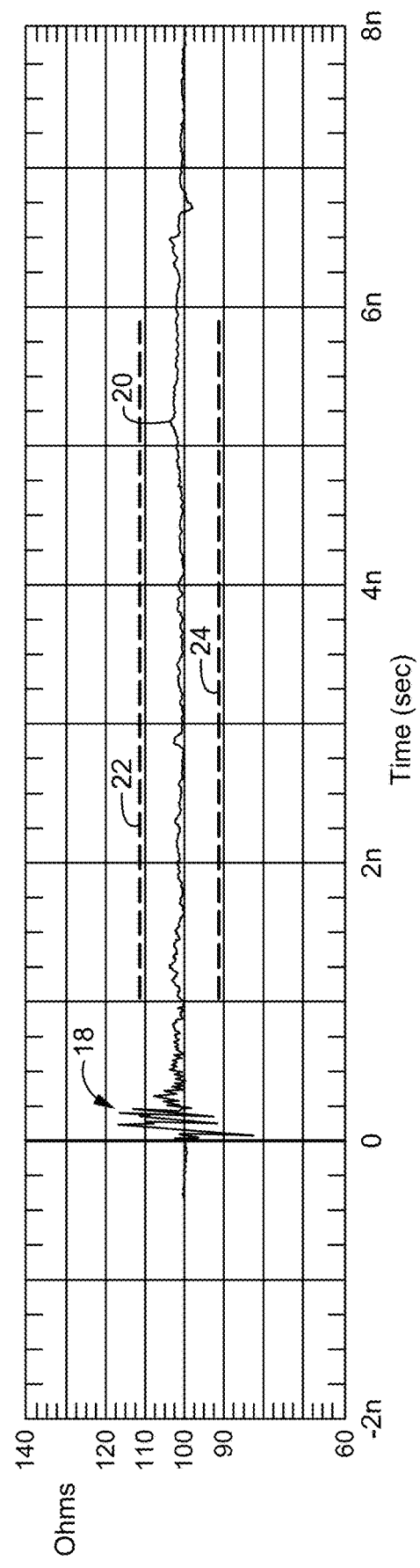

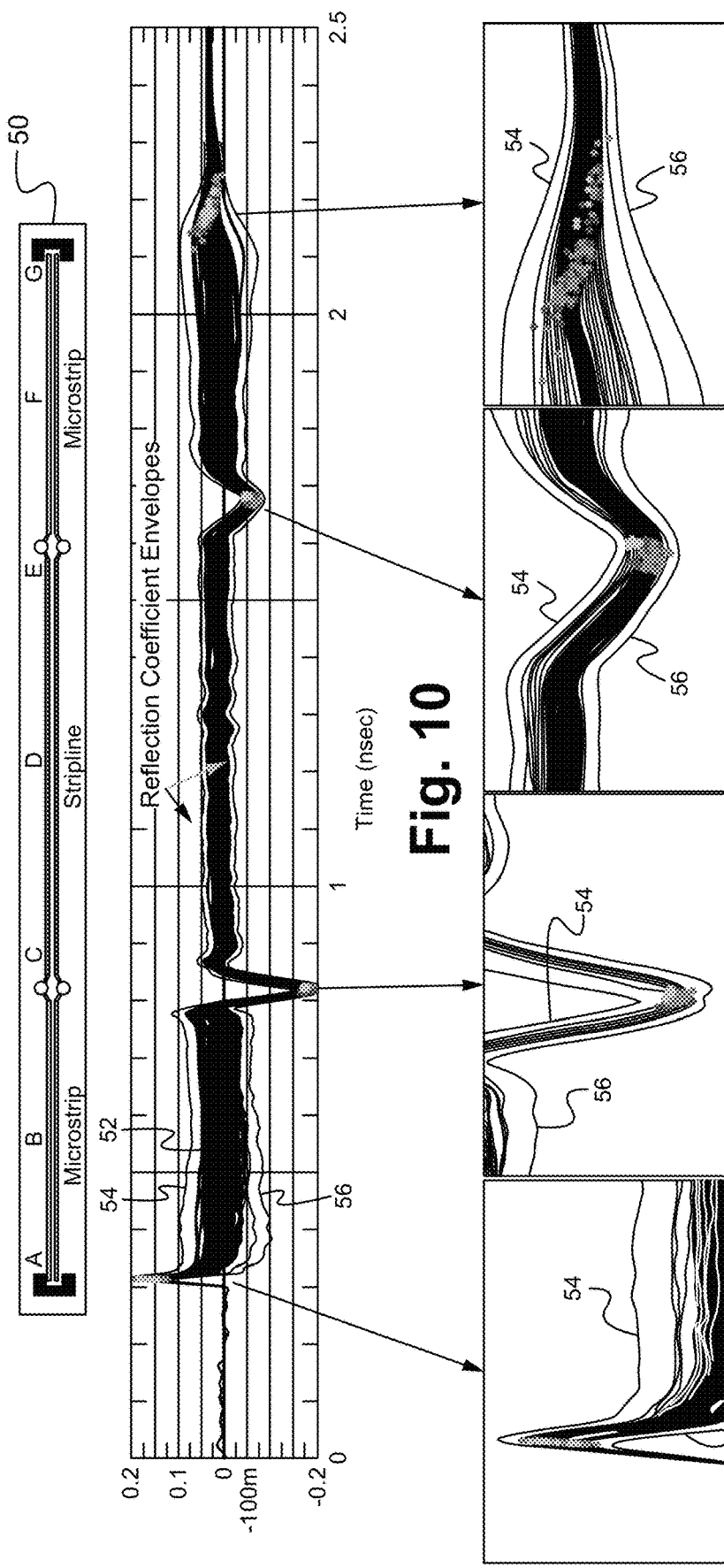

MEASURING COMPLEX PCB-BASED INTERCONNECTS IN A PRODUCTION ENVIRONMENT

RELATED APPLICATIONS

This Patent Application claims priority under 35 U.S.C. 119(e) of the U.S. Provisional Patent Application, Application No. 62/352,884, filed on Jun. 21, 2016, and entitled "Measuring Complex PCB-Based Interconnects In A Production Environment," which is hereby incorporated by reference in its entirety.

FIELD OF THE INVENTION

The present invention is generally directed to measuring characteristics of a printed circuit board. More specifically, the present invention is directed to measuring complex printed circuit board based interconnects in a production environment.

BACKGROUND OF THE INVENTION

A time-domain reflectometer (TDR) is an electronic instrument that uses time-domain reflectometry to characterize a conductor or any other electrical transmission path. A TDR measures reflections along a conductor, such as a transmission line on a printed circuit board (PCB). In order to measure such reflections, the TDR transmits an incident electrical signal onto the conductor and measures a corresponding reflected signal. If the conductor is of a uniform impedance and is properly terminated, then there will be no reflections and the remaining incident electrical signal is absorbed at the far-end conductor termination point. Instead, if there are impedance variations on the conductor, then some of the incident electrical signal is reflected back to the source.

The reflection coefficient is a parameter that describes how much of the electrical signal is reflected by the impedance variation in the electrical transmission path. The reflection coefficient is equal to the ratio of the amplitude of the reflected signal to the incident signal. For example, in an electrical transmission line the reflection coefficient provides a measure of how much an electrical signal is reflected by an impedance.

The TDR measures the reflection coefficient at a given test point and calculates the characteristic impedance according to the measured reflection coefficient. The TDR is commonly used to determine the characteristic impedance of a transmission line, or interconnect, on a PCB. The characteristic impedance is measured to verify the proper manufacturing of the transmission lines on the PCB. In high performance PCBs, the transmission line interconnects must have a proper characteristic impedance Z0, and the characteristic impedance Z0 should be a specific value, such as 50 ohms, depending on the particular design. The TDR measures the reflection coefficient $\rho$ and calculates the corresponding characteristic impedance Z0 of the transmission line according to the conversion formula:

$$Z0 = 50(1+\rho)/(1-\rho) \qquad (1)$$

The constant value "50" in equation (1) may be different depending on the application. For example, the characteristic impedance of a differential transmission line can be calculated by replacing the constant value "50" with "100".

A PCB is made on a panel that also includes "coupons" which are conductive traces on the surface of the panel, made to mimic the transmission lines, where the characteristic impedance measurements are made. In the manufacturing environment, when the PCB is built, the characteristic impedance is measured at one or more coupon locations, the measurement being made by a TDR.

SUMMARY OF THE INVENTION

Embodiments are directed to a measuring system and method configured to analyze numerous different types of interconnects having varying degrees of complexity. The measuring system and method characterizes an interconnect to be tested by a predefined reflection coefficient signature. Each specific interconnect is predefined by a reflection coefficient signature that is unique to that specific interconnect. Once the reflection coefficient signature is defined, a corresponding reflection envelope is defined which defines boundary limits about the reflection coefficient signature. Subsequent testing of the specific interconnect results in a measured reflection coefficient curve, which is compared to the corresponding reflection envelope. The specific interconnect under test is considered acceptable if the values of the measured reflection coefficient curve do not fall outside the reflection envelope. If one or more values of the measured reflection coefficient curve fall outside the reflection envelope, then the specific interconnect under test fails the test.

In an aspect, a method of testing a printed circuit board is disclosed. The method includes defining a specific interconnect structure of the printed circuit board to be tested, defining a predetermined reflection coefficient signature corresponding to the specific interconnect structure, defining a reflection envelope around the reflection coefficient signature, wherein the reflection envelope defines tolerance boundaries on both sides of the reflection coefficient signature, measuring a reflection coefficient for the specific interconnect structure to determine a measured reflection coefficient curve corresponding to the specific interconnect structure, and comparing the measured reflection coefficient curve to the reflection envelope, wherein if all values of the measured reflection coefficient curve are within the reflection envelope then the specific interconnect structure passes the test, and if one or more values of the measured reflection coefficient curve are not within the reflection envelope then the specific interconnect structure fails the test. In some embodiments, the reflection coefficient signature includes a curve, each point on the curve defining a reflection coefficient value versus time. In some embodiments, one or more portions of the reflection coefficient signature are a non-linear curve. In some embodiments, defining the reflection coefficient signature comprises performing a computer simulation using a computer design of the printed circuit board and calculating a simulated reflection coefficient curve according to the simulation, wherein the simulated reflection coefficient curve is the reflection coefficient signature. In some embodiments, defining the reflection coefficient signature comprises manufacturing a plurality of prototype interconnect structures, measuring the reflection coefficient curve of each of the plurality of prototype interconnect structures, and calculating the reflection coefficient signature according to the measures reflection coefficient curve of each of the plurality of prototype printed circuit boards. In some embodiments, measuring the reflection coefficient is performed using time domain reflectometry. In some embodiments, each specific interconnect structure has a unique reflection coefficient signature. In some embodiments, different portions of the reflection envelope have different tolerances relative to a corresponding portion of the reflection coefficient signature. In some embodiments, the reflection envelope is fine-tuned to match a corresponding shape of the reflection coefficient signature.

In another aspect, a testing device is disclosed. The testing device includes a measurement module, a memory and a processor. The measurement module is configured to measure a reflection coefficient for a specific interconnect structure to determine a measured reflection coefficient curve corresponding to the specific interconnect structure. The memory is configured to store a reflection envelope, wherein the reflection envelop defines tolerance boundaries around a reflection coefficient signature corresponding to the specific interconnect structure. The processor is configured to compare the measured reflection coefficient curve to the reflection envelope, wherein if all values of the measured reflection coefficient curve are within the reflection envelope then the specific interconnect structure passes the test, and if one or more values of the measured reflection coefficient curve are not within the reflection envelope then the specific interconnect structure fails the test. In some embodiments, the reflection coefficient signature includes a curve, each point on the curve defining a reflection coefficient value versus time. In some embodiments, one or more portions of the reflection coefficient signature are a non-linear curve. In some embodiments, the measurement module is configured to measure the reflection coefficient using time domain reflectometry. In some embodiments, each specific interconnect structure has a unique reflection coefficient signature. In some embodiments, different portions of the reflection envelope have different tolerances relative to a corresponding portion of the reflection coefficient signature. In some embodiments, the reflection envelope is fine-tuned to match a corresponding shape of the reflection coefficient signature.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 1 illustrates an exemplary characteristic impedance curve corresponding to a lossless transmission line.

FIG. 2 illustrates the characteristic impedance curve of FIG. 1 with constant limit lines.

FIG. 10 illustrates an exemplary reflection envelope predefined based on a compilation of all the measured reflection coefficient curves of multiple prototype interconnect structures.

FIG. 11 shows an enlarged view of section A from FIG. 10.

FIG. 12 shows an enlarged view of section C from FIG. 10.

FIG. 13 shows an enlarged view of section E from FIG. 10.

FIG. 14 shows an enlarged view of section G from FIG. 10.

DETAILED DESCRIPTION OF THE EMBODIMENTS

Figure 3:
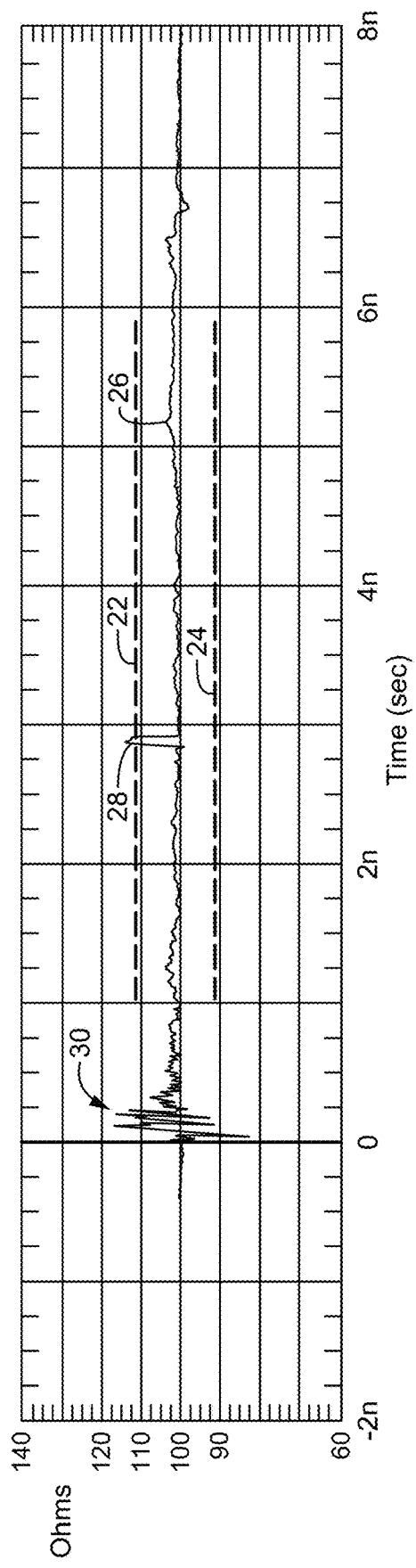
FIG. 3 illustrates an exemplary characteristic impedance curve corresponding to another lossless transmission line.

Embodiments of the present application are directed to a measuring system and method. Those of ordinary skill in the art will realize that the following detailed description of the measuring system and method is illustrative only and is not intended to be in any way limiting. Other embodiments of the measuring system and method will readily suggest themselves to such skilled persons having the benefit of this disclosure.

Reference will now be made in detail to implementations of the measuring system and method as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

An interconnect, or interconnect structure, can be defined as single interconnect element or a combination of interconnect elements within the PCB. For example, a via interconnect structure can be considered as a via barrel, a via pad, a via anti-pad or any combination of the three. Each of these via interconnect structures exhibit different responses.

An issue with evaluating interconnects is that there are additional structures beyond simply transmission lines that impact the performance of a given interconnect. Depending on where such additional structures are positioned within a given interconnect and how such additional structures are used may or may not be significant to the performance of the interconnect. The flexibility of defining reflection envelopes in a desired configuration ensures that the significant structures of an interconnect are properly characterized in a manufacturing environment so as to enable measuring of a defined characteristic, the reflection coefficient, related to these structures and determining if the measured characteristic meets design specifications. Conventional application of a TDR uses the premise that the calculated characteristic impedance can be evaluated against a constant tolerance value. For example, a lossless transmission line is expected to have a characteristic impedance of 50 ohms, and an acceptable tolerance is +/−10%, or 5 ohms. However, such an approach is only useful for testing and measuring a lossless transmission line. For interconnect structures that have an expected non-constant characteristic impedance value, or other type of measured value, such a method is not useful. There are number of additional interconnect structures in a PCB that are not lossless transmission lines, and an alternative methodology than the use of equation (1) for calculating a characteristic impedance and comparing the calculated characteristic impedance to some expected constant limit values is needed.

The TDR measures the reflection coefficient of many different types of interconnect structures beyond just lossless transmission lines. The measured reflection coefficient is the starting point for characterizing many structural components that make up a complex PCB-based interconnect. Examples of such characteristics that can be determined using the measured reflection coefficient $\rho$ include, but are not limited to, lossless transmission line impedance ($Z0=50$ $(1+\rho)/(1-\rho)$), loss transmission line (transmission lines with expected losses) impedance (slope=$d\rho/dt$), lumped element capacitance (dip area of a reflection coefficient curve as an integration of $\rho$ over time), lumped element inductance (peak area of a reflection coefficient curve as an integration of $\rho$ over time), via stub resonant frequency (resonant frequency $f_{res}=1/\Delta t$, where $\Delta t$ is the time between zero crossings on a reflection coefficient curve) and electrically long structural resonances ($\Delta \rho$, $\Delta t$ using Bounce/Lattice diagrams).

One method for testing of the various characteristics is to calculate the value of the specific characteristic in question using various mathematical equations described above, but this is rather daunting in a manufacturing environment. For example, if there is a lumped element capacitance to be determined, then the value can be calculated according to $\int \rho \, \partial t$. However, using another method, as applied by the measuring system and method, such calculation of the actual characteristic value does not need to be made. Instead, the measured reflection coefficient $\rho$ is compared to an expected value of the reflection coefficient $\rho$, defined by the reflection envelope, as described below. For example, for a lossless transmission line impedance, the reflection coefficient $\rho$ should be zero, +/−10 mrho for all values of the measured reflection coefficient curve, where the reflection coefficient curve is a measure of the reflection coefficient $\rho$ over time. If each value of the reflection coefficient curve is not within +/_10 mrho of zero, then the characteristic impedance Z0 for the transmission line is off. This is determined without calculating the actual characteristic impedance of the transmission line. As another example, for lumped element capacitance, a measured reflection coefficient curve should have a dip (explained in greater detail below) of specific values at specific times. If the measured reflection coefficient curve does not match or fall within a predefined reflection envelope, then the lumped element capacitance is off. If the dip is too small, then the lumped element capacitance is too small. If the dip is too large, then the lumped element capacitance is too large, for example. In general, it is desired for the measured reflection coefficient $\rho$ to fall within a predefined reflection envelope for a given characteristic, interconnect structure and application. The measuring system and method simply measures the reflection coefficient $\rho$ and determines if the measured reflection coefficient $\rho$ falls within a predefined reflection envelope. There is no need to perform calculations using measured $\rho$ to determine an absolute value for the characteristic being measured, such as characteristic impedance, capacitance, inductance or the like.

The reflection envelope is a predetermined set of values, for example a look up table, that is compared to the values of the measured reflection coefficient curve. Any characteristic to be measured can be characterized by a predefined reflection envelope, or set of boundary values. Loss or lossless transmission line impedance, lumped element capacitance, lumped element inductance, etc. can all be characterized by a predefined reflection envelope of reflection coefficient values. Each type of characteristic to be evaluated has it's own specific predefined reflection envelope. As printed circuit boards move to higher performing interconnects, each interconnect has a different reflection coefficient signature. The measuring system and method enables testing each such interconnect by identifying a corresponding reflection coefficient signature for the interconnect, defining a corresponding reflection envelope and comparing a measured reflection coefficient curve to the defined reflection envelope to determine if the interconnect is manufactured within specification.

Following are number of examples of exemplary characteristic impedance curves and reflection coefficient curves for exemplary interconnect structures, and various methods for testing and measuring such interconnect structures using the exemplary curves. FIG. 1 illustrates an exemplary characteristic impedance curve corresponding to a lossless transmission line. The curve 20 shows the measurement made by a TDR for a lossless transmission line as converted into ohms, using a variation of the standard equation (1), in this case $Z0=100$ $(1+\rho)/(1-\rho)$ referred to as equation (2). For a truly lossless impedance line the characteristic impedance graph would be horizontal, with no slope. However, in practice, the actual characteristic impedance curve is not completely flat, such as the curve 20. The left hand side of the curve 20 shows a distinctive non-linear pattern 18 that includes peaks and dips due to resonances, ringing and/or other circuit characteristics associated with the particular interconnect being tested, subsequently referred to herein simply as a ringing pattern 18. In conventional methodologies, the characteristic impedance of a transmission line is determined to be within specification by using equation (2) to calculate the characteristic impedance Z0 and establishing set limits, e.g. +/−X % from a predefined characteristic impedance value. In the exemplary curve 20, the predefined characteristic impedance value Z0 is 100 ohms, and the acceptable limit is +/−10 ohms, shown as dashed limit lines 22, 24 in FIG. 2. Using this approach, the lossless transmission line corresponding to the curve 20 is determined to be within specification as all values of curve 20 are within the limit lines 22, 24. FIG. 3 illustrates an alternative example where a measurement is taken for a different lossless transmission line, the measurement shown as characteristic impedance curve 26. In this alternative lossless transmission line, there is a portion 28 of the curve 26 that does not fall within the upper limit line 22, and as such this alternative lossless transmission line fails the test and does not meet specification.

Further, limit lines used in this manner cannot be applied to the initial portion of a curve, for example the ringing pattern 18 in curve 20 (FIG. 2) or the ringing pattern 30 in curve 26 (FIG. 3), due in part because this initial portion of the curve is not due to the characteristic impedance of the measured lossless transmission line. Using this approach, this initial portion of the measurement is not evaluated, and therefore the characteristics associated with this portion of the measurement can not be evaluated.

Figure 4:
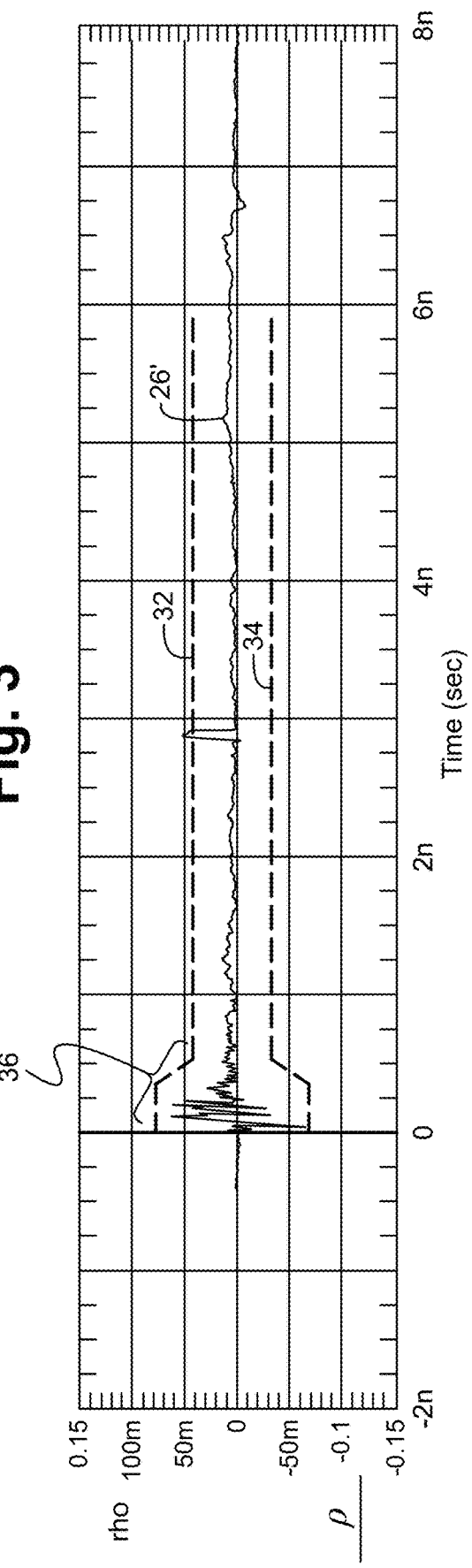
FIG. 4 illustrates an exemplary reflection coefficient curve corresponding to a lossless transmission line.

However, using reflection envelopes instead of limit lines enables the initial portion of the curve to be evaluated. FIG. 4 illustrates an exemplary reflection coefficient curve corresponding to a lossless transmission line. The reflection coefficient curve shown in FIG. 4 corresponds to the same lossless transmission line tested in relation to the characteristic impedance curve 26 of FIG. 3. As such, the curve 26' in FIG. 4 is simply the reflection coefficient curve used as the basis for applying equation (2) to calculate the characteristic impedance curve 26 in FIG. 3. A reflection envelope is defined by the upper boundary 32 and the lower boundary 34. The reflection envelope 32, 34 is predefined and defines the set of acceptable reflection coefficient values for a specific interconnect structure, in this case a lossless transmission line, to pass the test and be considered within specification. As shown in FIG. 4, the reflection envelope is not restricted to constant limit lines, as in FIGS. 2 and 3. Portion 36 of the reflection envelope is particularly tailored to evaluate the initial ringing pattern of the reflection coefficient curve. Further, although the remaining portion of the reflection envelope other than portion 36 is shown as constant boundaries, it is understood that alternatively shaped boundaries are also contemplated, for example as shown in FIGS. 10-14.

Figure 5:
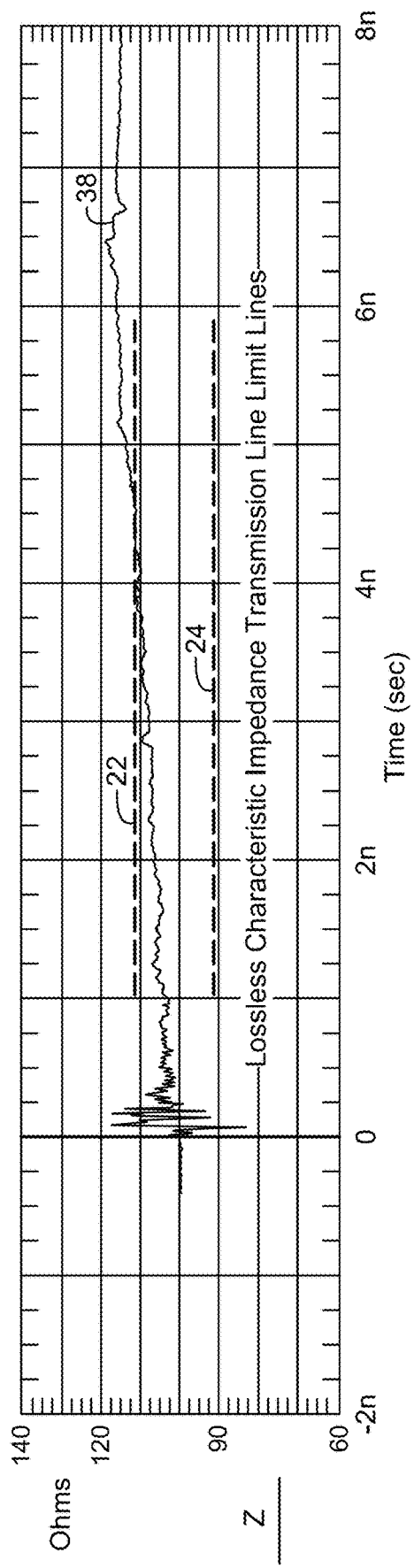
FIG. 5 illustrates an exemplary characteristic impedance curve corresponding to a loss transmission line and corresponding constant limit lines.

Interconnect structures other than lossless transmission lines can also be evaluated. FIG. 5 illustrates an exemplary characteristic impedance curve 38 corresponding to a loss transmission line. As shown in curve 38, the characteristic impedance curve has a positive slope, it is not horizontal. Such a non-flat slope is due to an interconnect's transmission line losses, which may or may not be acceptable by design. Using the approach of measuring the interconnect structure by it's characteristic impedance and applying constant limit lines, such as the limit lines 22, 24, the loss transmission line is determined to be out of specification since the curve 38 exceeds the upper limit line 22 from the 4.5 nsec time forward. If this curve had been for a lossless transmission line, this approach would accurately determine that the lossless transmission line does not meet design specifications. However, using equation (2) and the characteristic impedance limit lines in this manner for testing a loss transmission line inaccurately determines that such a loss transmission line does not meet design specification even though the transmission line in this case is designed to be a loss transmission line having acceptable losses. Equation (2) is inaccurate for those designs with acceptable transmission line losses. Further, the initial portion of the curve 38 can not be evaluated using the constant limit lines 22, 24.

Figure 6:
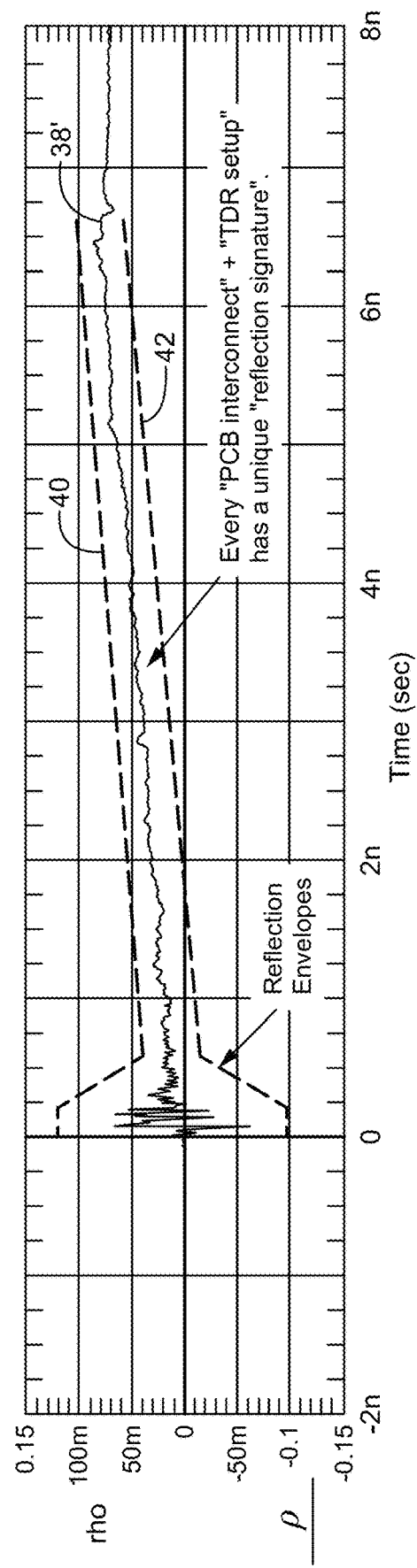
FIG. 6 illustrates an exemplary reflection coefficient curve corresponding to a loss transmission line and corresponding reflection envelope.

However, using a reflection envelope instead of limit lines enables an accurate evaluation of a loss transmission line. FIG. 6 illustrates an exemplary reflection coefficient curve corresponding to a loss transmission line. The reflection coefficient curve shown in FIG. 5 corresponds to the same loss transmission line tested in relation to the characteristic impedance curve 38 of FIG. 5. As such, the curve 38' in FIG. 6 is simply the reflection coefficient curve used as the basis for applying equation (2) to calculate the characteristic impedance curve 38 in FIG. 5. A reflection envelope is defined by the upper boundary 40 and the lower boundary 42. In the case of the loss transmission line, which is the same interconnect structure as that measured to generate the characteristic impedance curve in FIG. 5, the reflection envelope applied to the loss transmission line in FIG. 6 represents acceptable line losses, shown as non-constant boundaries lines at the point greater than about 0.5 nsec. Additionally, the reflection envelope can also be predefined for the initial portion of the measurement having the distinctive non-linear pattern (ringing pattern), and as such the characteristics affecting this initial pattern can be tested using the reflection envelope.

Each interconnect structure has a specific reflection coefficient signature. For each specific circuit design, the reflection coefficient signature and the reflection envelope for each specific interconnect can be predetermined. Different designs and different interconnect structures will have different reflection coefficient signatures and corresponding reflection envelopes. The boundaries that define the reflection envelope are predefined prior to testing, for example during design and/or prototyping. An acceptable reflection envelope is then determined for the reflection coefficient signature, the reflection envelope indicating acceptable reflection coefficient measurements when testing the specific interconnect structure. In the manufacturing environment, the interconnect structure is tested by the TDR and the measured reflection coefficient values (the reflection coefficient curve) are determined to be either within the reflection envelope or not. If the measured reflection coefficient values are within the reflection envelope, then the interconnect structure passes the test and is considered within design specification. If the measured reflection coefficient values are not within the reflection envelope, then the interconnect structure fails the test. Using this approach, all structures of a particular interconnect can be characterized according to the reflection coefficient $\rho$, not just lossless transmission line sections.

Characteristic impedance graphs may also have non-constant and/or non-linear shapes due to electrically short (discrete) non-transmission line structures like vias, test pads, differential pair skew compensation and via fields. Such interconnect structures can not be accurately tested for by measuring and calculating characteristic impedance using equation (2) and applying constant limit lines as in the conventional approach. The reflection envelope is used in place of the particular equations for specific interconnect structures, either transmission line or non-transmission line structures.

Figure 7:
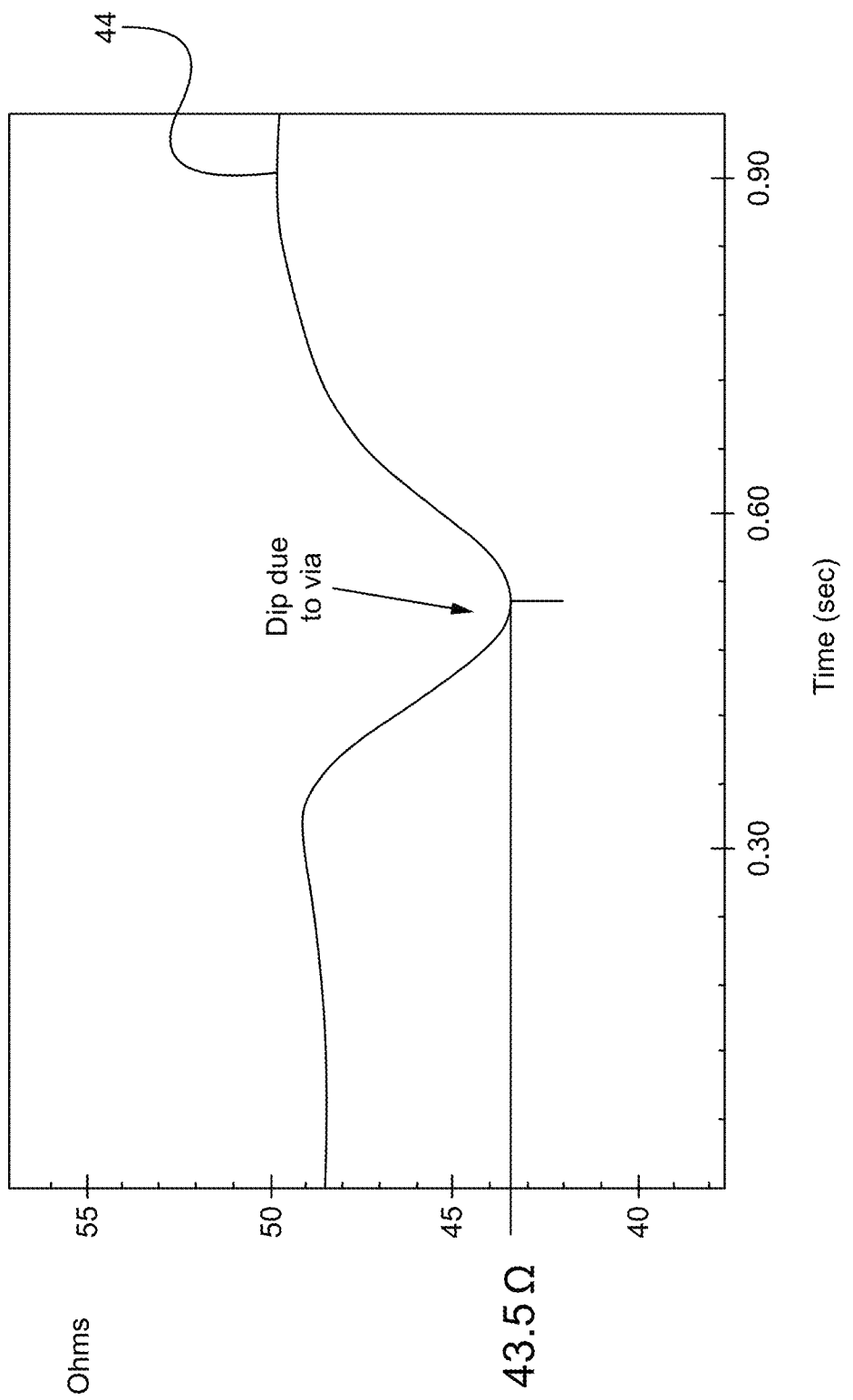
FIG. 7 illustrates an exemplary characteristic impedance curve corresponding to a via interconnect structure.

Similarly to transmission lines, various approaches can be applied to testing and measuring a via interconnect structure. FIG. 7 illustrates an exemplary characteristic impedance curve corresponding to a via interconnect structure. The curve 44 shows the measurement made by a TDR for an exemplary via interconnect structure as converted into ohms, using the standard equation (1). In this case, the via interconnect structure is characterized by a measured characteristic impedance. The measured characteristic impedance has a dip due to the via interconnect structure. As shown in curve 44, the dip has a low characteristic impedance value of 43.5 ohms. In the case where the tolerance for the characteristic impedance is determined as +/−10% of an ideal value, and the ideal value is 50 ohms, the constant limit lines are at 45 ohms and 55 ohms. Using this approach, the exemplary via interconnect structure under test fails since the dip at 43.5 ohms drops below the lower limit line of 45 ohms.

Figure 8:
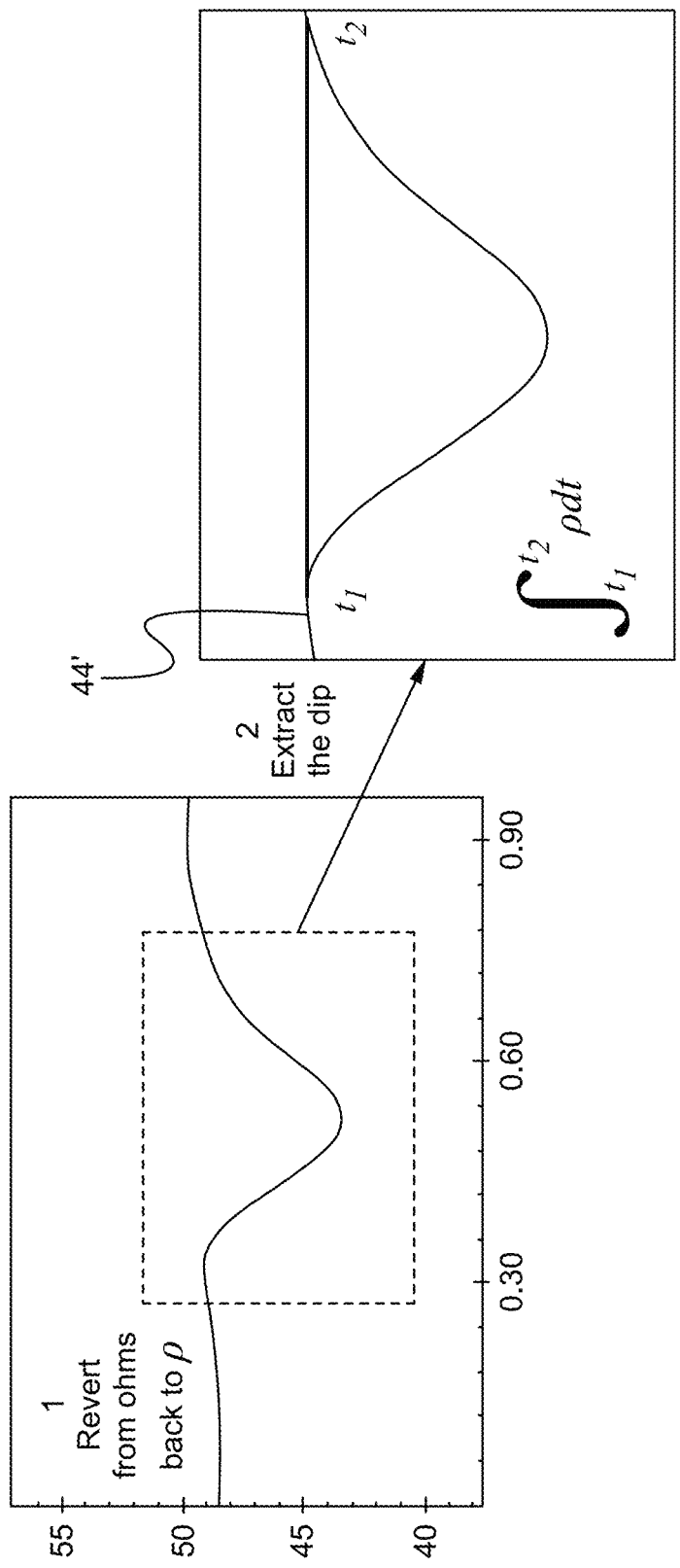
FIG. 8 illustrates an equivalent reflection coefficient curve corresponding to the characteristic impedance curve of FIG. 7 and a procedure for evaluating an equivalent lumped element capacitance of a via interconnect structure.

However, this approach is inherently flawed because via interconnect structures should not be characterized like a transmission line and measured in ohms. A via interconnect structure behaves like a lumped element (discrete) shunt capacitor, not a transmission line. Proper characterization of a via interconnect structure requires extracting the via's lumped element equivalent capacitance, which is calculated in farads, not ohms. The lumped element equivalent capacitance can be characterized using the measured reflection coefficient. Instead of measuring the via interconnect structure by its characteristic impedance, the via interconnect structure is measured by its reflection coefficient, such as shown by the equivalent reflection coefficient curve 44' in FIG. 8. Using the reflection coefficient curve 44', the lumped element equivalent capacitance is calculated as the integration of the measured reflection coefficient ρ during the time period corresponding to the via interconnect structure (the dip in curve 44'), shown as time t1 to t2. The resulting value is then normalized to ideal characteristic impedance value, in this case 50 ohms, to calculate a lumped element equivalent capacitance of 0.427 pF. Detailed examples of calculating a shunt capacitance, as well as calculating a series inductance are found in the article "Measuring Parasitic Capacitance and Inductance Using TDR" by David J. Dascher published in Hewlett-Packard Journal, Article 11, August 1996, which is hereby incorporated in its entirety be reference. The calculated lumped element equivalent capacitance value can then be compared to an application specific ideal lumped element equivalent capacitance to determine if the via interconnect structure is within specification. This method works for calculating the equivalent lumped element capacitance of all "dips" in a complex interconnect structure's reflection coefficient measurement, not just for vias. For example, the equivalent lumped element capacitance can be calculated in this manner for component pads. A component pad is an electrical and mechanical connection point to which a component is attached, such as capacitors, inductors, resistors, integrated circuits, etc. It should be emphasized that the analysis performed herein is for characterizing the interconnect structure itself, such as the via or component pad, not any component attached to the interconnect structure. However, such calculations are processing intensive. Conventional TDRs do not include such computational methodologies. Conventional TDRs merely measure the reflection coefficient ρ and calculate a corresponding characterized impedance Z0 using equation (1) or similar equation. The additional calculation steps for determining an equivalent lumped element capacitance are performed by a separate computing device or processing mechanism.

Figure 9:
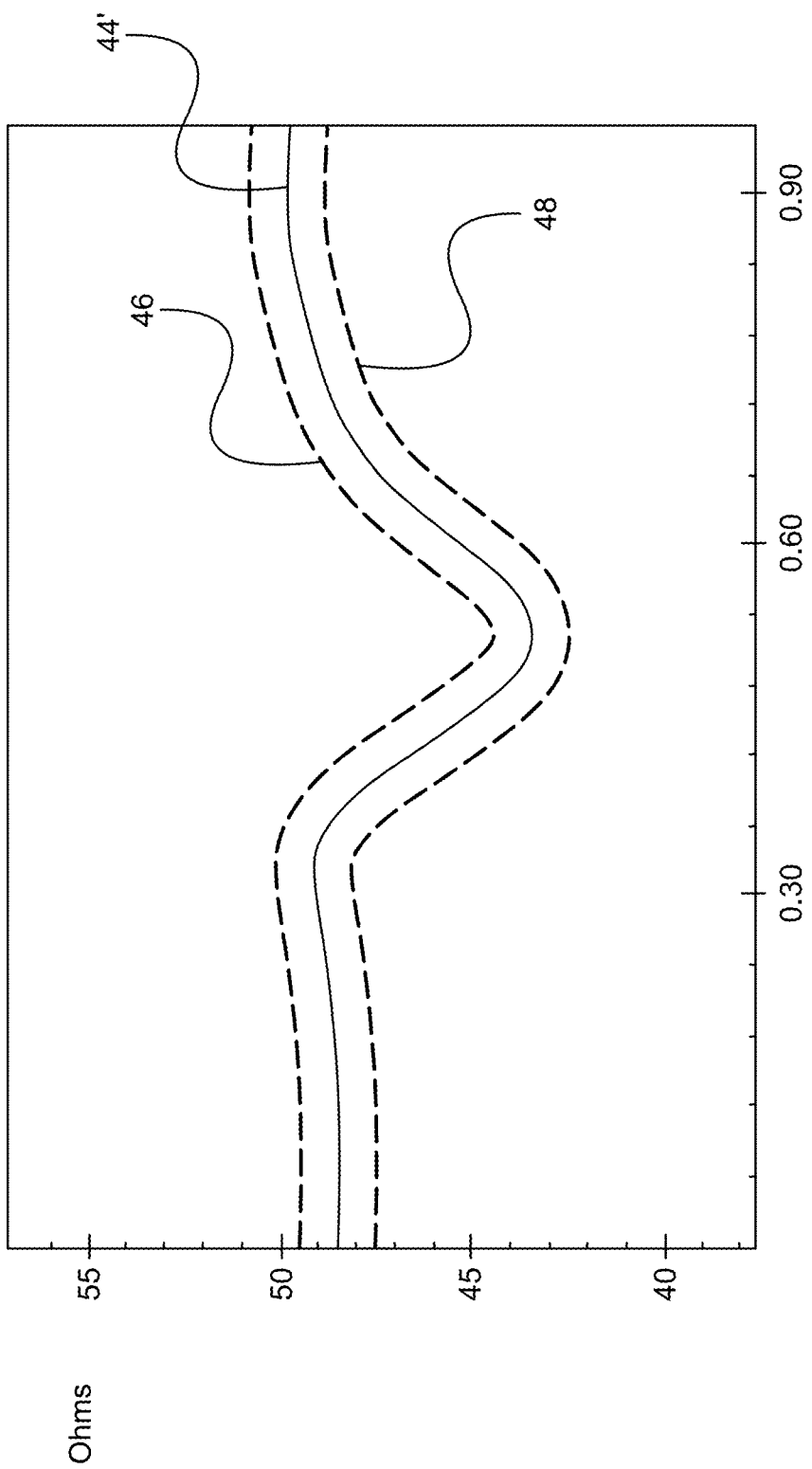
FIG. 9 illustrates an exemplary reflection coefficient curve corresponding to an exemplary via interconnect structure.

Instead of calculating the area of the dip corresponding to the via interconnect structure, or other type of interconnect structure that has dips in its reflection coefficient curve, a reflection envelope is defined for a predefined reflection coefficient signature that includes such a dip. FIG. 9 illustrates an exemplary reflection coefficient curve corresponding to an exemplary via interconnect structure. The reflection coefficient curve 44' shown in FIG. 9 corresponds to the same reflection coefficient curve 44' in FIG. 8. Predefined boundaries 46, 48 define a reflection envelope corresponding to a predefined coefficient reflection signature for a specific via interconnect structure. The curve 44' represents the measured reflection coefficient curve for a via interconnect structure under test that is to be compared to the specific via interconnect structure using reflection envelope 46, 48. In this particular case, the via interconnect structure under test passes the test since all values of the measured reflection coefficient curve fall within the reflection envelope 46, 48. Using the measuring system and method in this manner eliminates the need to perform processing intensive calculations of the actual lumped element equivalent capacitance.

All these complex interconnect structures can be characterized using a reflection coefficient signature, and corresponding boundaries can be defined about each reflection coefficient signature as a predefined reflection envelope. The objective of the measuring system and method is to output a pass or fail, not an absolute value such as the ohms of a transmission lines, the capacitance of a via, etc. For example, the measured reflection coefficient values of a via interconnect structure results in a dip in the reflection coefficient curve. The capacitance of the via interconnect structure can be determined as the area of the dip. Alternatively, during design the via interconnect structure is designed to have a specific capacitance, which can be represented as an equivalent reflection coefficient signature. During manufacturing, it is only necessary to determine if the via interconnect structure in the manufactured printed circuit board meets the designed specification. Acceptable tolerance is defined by a reflection envelope around the predefined reflection coefficient signature for the via interconnect structure being tested. The objective is to determine if the measured reflection coefficient curve falls within the predefined reflection envelope. It is not necessary to determine the actual capacitance of the via interconnect structure being tested.

The measuring system and method outputs a pass or fail. In the case of failing, the measuring system and method can also output at what time on the measured reflection coefficient curve the failure occurs. Working backward from the determined fail time, a distance can be determined from the test point (on the coupon) which leads to the specific structure location on the interconnect that has failed. Other failure conditions can also be determined by comparing the predefined reflection coefficient signature to the actual measured reflection coefficient curve. For example, a loss transmission line is designed with a specific amount of loss that is shown as a specific slope on its predefined reflection coefficient signature. If the measured reflection coefficient curve has a greater slope than the predefined reflection coefficient signature, then a likely cause is that the width of the loss transmission line is too narrow or perhaps there is an over abundance of a higher loss dielectric that had been added to the transmission line.

The measured reflection coefficient curve can be further analyzed to determine additional characteristics. The initial ringing pattern in some measured reflection coefficient curves, such as the ringing pattern 30 in FIG. 3, may be the result of a via stub resonant frequency. The resonant frequency can be determined through analysis of the measured reflection coefficient curve. If the difference, Δt, between each zero crossing is determined, then the resonant frequency fres of the via stub can be determined according to the formula: fres=1/Δt. This is an extra step beyond simply comparing the measured reflection coefficient curve to the reflection envelope. If the ringing pattern is a significant characteristic to be measured, the TDR can be set to measure only the initial time period, e.g. less than 0.5 nsec, and the time scale (horizontal axis of the graph) can be extended to show smaller increments of time, and a more fine-tuned reflection envelope can be defined to more closely evaluate the ringing pattern. For example, a reflection envelope can be defined that has a series of up and down boundaries that mirror the peaks and valleys of an anticipated ringing pattern. The reflection envelope 40, 42 shown in FIG. 6 is not a fine-tuned envelope in regard to the initial ringing pattern. Instead, the reflection envelope 40, 42 is courser envelope. In general, defining the shape of the upper and lower boundaries of the reflection envelope is application specific. Each interconnect structure has a different associated reflection coefficient signature. By expanding or contracting the time scale, different portions of the reflection coefficient signature can be expanded or contracted with corresponding course or fine-tuned portions of the reflection envelope signature defined for each different portion. In this manner, the testing of a particular interconnect structure can be as precise or loose in the characterization of the interconnect structure as desired.

In some embodiments, the reflection coefficient signature can be determined using simulation software and the reflection envelope can be defined as a tolerance, for example +/−10%, for each reflection coefficient value in the reflection coefficient signature. In other embodiments, a number of prototype printed circuit boards can be manufactured and the reflection coefficient signature is calculated based on the measured reflection coefficient curves of the prototype PCBs. For example, the reflection coefficient signature can be calculated as the mean of the measured reflection coefficient curves of each of the prototype PCBs, or the reflection coefficient signature can be considered a compilation of all the measured reflection coefficient curves of the prototype PCBs. Regardless of determining the reflection coefficient signature, the reflection boundary can be optimized to any degree of granularity. For example, the upper boundary may have a different tolerance than the lower boundary, or different portions (as measured along the time axis) may have different boundary tolerances than other portions, even down to different boundary tolerances per each coordinate on the reflection coefficient signature.

FIG. 10 illustrates an exemplary reflection envelope predefined based on a compilation of all the measured reflection coefficient curves of multiple prototype interconnect structures. The measured reflection coefficient curves each correspond to a complex interconnect structure prototype of the type shown in coupon 50. A "coupon" section is included on a panel that also includes a PCB. The TDR measurement is made by applying a probe to the coupon, such as at section A in coupon 50. The coupon is a clone representative of the actual interconnect structure on the PCB desired to be tested. Coupon 50 includes a section A, a microstrip section B, a via interconnect structure C, a stripline section D, a via interconnect structure E, a microstrip section F, and a section G. Sections A and G represent the interconnect structures that can include component pads or any vias that are used to route the signal between the outside layers (where the components are attached to) and any inner routing layers. Microstrip transmission lines are geometries used to route signals on the outside layers of a PCB. Stripline transmission lines are used to route signals on inner layers of the PCB. It is understood that stripline and microstrip transmission lines are only examples and that conventional PCB can include multiple other types of transmission lines that are well known in the art, each of which can be characterized and tested by the measuring system and method. In other words, all transmission line geometries have corresponding reflection coefficient values that can be characterized by and tested by the measuring system and method.

The curve 52 is a compilation of multiple individual curves each representing the measured reflection coefficient curve for one prototype interconnect structure. The curve 52 covers a range of reflection coefficient values for each sample time, and as such a corresponding reflection envelope has boundaries 54, 56 that bound the range of reflection coefficient values. In some embodiments, the range of reflection coefficient boundaries can be restricted, such as by removing outlying individual curves. FIG. 11 shows an enlarged view of section A from FIG. 10. FIG. 12 shows an enlarged view of section C from FIG. 10. FIG. 13 shows an enlarged view of section E from FIG. 10. FIG. 14 shows an enlarged view of section G from FIG. 10. Some portions of the reflection envelope can have tighter tolerances than other portions, such as the portion of boundaries 54, 56 corresponding to microstrip section B having broader tolerance than the portion of boundaries 54, 56 corresponding to stripline section D. It can also be seen that certain interconnect structures may be of similar type, such as sections C and E both being via interconnect structures, but designed to have different reflection coefficient signatures, as shown in the different dips of FIGS. 12 and 13. In general, the reflection envelopes can narrow around smaller measured variations in the prototypes and expand around larger measured variations.

The predefined reflection coefficient signature for a specific interconnect structure is the designed reflection coefficient curve that should result from a measurement taken at a specific testing location on the PCB. As such, part of defining the predefined reflection coefficient signature for a specific interconnect structure is defining the designed reflection coefficient curve and the specific location at which this measurement is to be taken for the specific interconnect structure. In some embodiments, a look up table is used. The look up table includes multiple related entries for a specific interconnect structure to be tested, one entry includes the specific measurement location on the printed circuit board and another entry includes the associated reflection envelope for a measurement taken at that specific measurement location.

Figure 15:
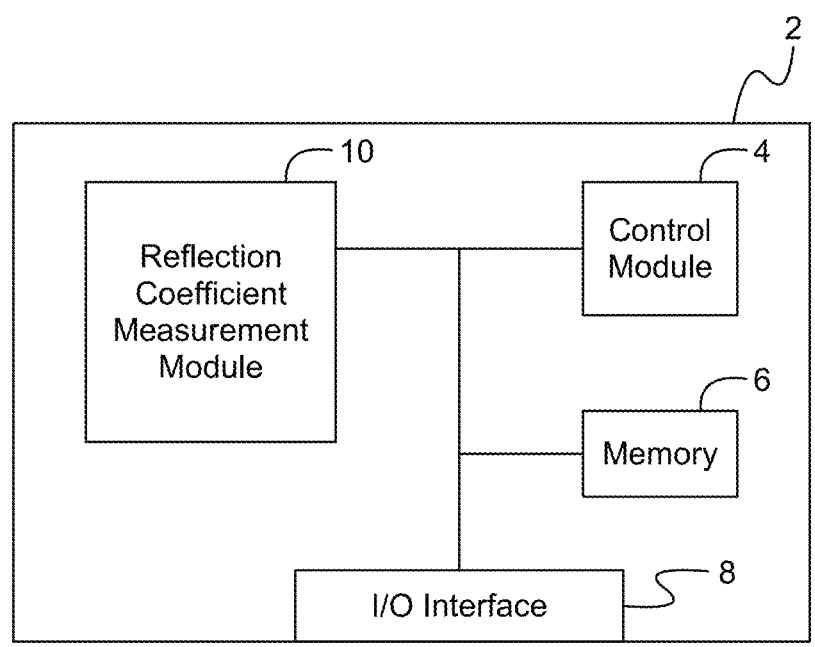
FIG. 15 illustrates a block diagram of an exemplary TDR configured to implement the measuring system and method according to some embodiments.

The measuring system and method can be implemented as a complimentary device to an existing TDR or can be integrated within an existing TDR. In some embodiments, the measuring system and method is implemented by taking a preexisting TDR and instituting a software change to be executed by the device processor and storing look up tables of predefined reflection envelopes and related entries. FIG. 15 illustrates a block diagram of an exemplary TDR configured to implement the measuring system and method according to some embodiments. The TDR 2 includes a control module 4, a memory 6, an input/output (I/O) interface 8 and a reflection coefficient measurement module 10. The measurement module 10 can be any conventional device configured to implement time-domain reflectometry for measuring a reflection coefficient at a specific testing location on a transmission medium, such as a coupon or other testing point on a PCB. The memory 6 can include both fixed and removable media using any one or more of magnetic, optical or magneto-optical storage technology or any other available mass storage technology. The control module 4 includes processing and control circuitry and logic that can include, but is not limited to, a central processing unit (CPU), a microcontroller unit (MCU), a microprocessor unit (MPU) or other conventional type of control and logic circuitry for performing processing and control functionality of the TDR 2. The control module 4, in conjunction with the memory 6 and measurement module 10, is configured to implement the measuring system and method described herein. Relevant portions of the measuring system and method are stored as program instructions and data within the memory 6 and processed by the control module 4 as applications are typically processed. The I/O interface 8 can include a user interface, data input/output ports and a network interface. The network interface can include a physical interface circuit for sending and receiving data and control communications over a conventional network. An example of a network interface includes a network card connected to an Ethernet or other type of LAN. The user interface can include one or more of the following: keyboard, mouse, monitor, display, printer, modem, touchscreen, button interface and other devices. More or less components than those shown in FIG. 15 are able to be included in the TDR 2.

The present application has been described in terms of specific embodiments incorporating details to facilitate the understanding of the principles of construction and operation of the measuring system and method. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of testing a printed circuit board, the method comprising:
   a. defining a specific interconnect structure of the printed circuit board to be tested;
   b. defining a predetermined reflection coefficient signature corresponding to the specific interconnect structure;
   c. defining a reflection envelope around the reflection coefficient signature, wherein the reflection envelope defines tolerance boundaries on both sides of the reflection coefficient signature;
   d. measuring a reflection coefficient for the specific interconnect structure to determine a measured reflection coefficient curve corresponding to the specific interconnect structure; and
   e. comparing the measured reflection coefficient curve to the reflection envelope, wherein if all values of the measured reflection coefficient curve are within the reflection envelope then the specific interconnect structure passes the test, and if one or more values of the measured reflection coefficient curve are not within the reflection envelope then the specific interconnect structure fails the test.

2. The method of claim 1 wherein the reflection coefficient signature includes a curve, each point on the curve defining a reflection coefficient value versus time.

3. The method of claim 2 wherein one or more portions of the reflection coefficient signature are a non-linear curve.

4. The method of claim 1 wherein defining the reflection coefficient signature comprises performing a computer simulation using a computer design of the printed circuit board and calculating a simulated reflection coefficient curve according to the simulation, wherein the simulated reflection coefficient curve is the reflection coefficient signature.

5. The method of claim 1 wherein defining the reflection coefficient signature comprises manufacturing a prototype interconnect structure and measuring the reflection coefficient curve of the prototype interconnect structure.

6. The method of claim 1 wherein measuring the reflection coefficient is performed using time domain reflectometry.

7. The method of claim 1 wherein each specific interconnect structure has a unique reflection coefficient signature.

8. The method of claim 1 wherein different portions of the reflection envelope have different tolerances relative to a corresponding portion of the reflection coefficient signature.

9. The method of claim 1 wherein the reflection envelope is fine-tuned to match a corresponding shape of the reflection coefficient signature.

10. The method of claim 1 wherein the reflection envelope includes an upper limit boundary and a lower limit boundary around the reflection coefficient signature.

11. The method of claim 1 wherein the reflection coefficient signature is time-based and the measured reflection coefficient curve is time-based.

12. A testing device comprising:
   a. a measurement module configured to measure a reflection coefficient for a specific interconnect structure to determine a measured reflection coefficient curve corresponding to the specific interconnect structure;
   b. a memory configured to store a reflection envelope, wherein the reflection envelop defines tolerance boundaries around a reflection coefficient signature corresponding to the specific interconnect structure; and
   b. a processor configured to compare the measured reflection coefficient curve to the reflection envelope, wherein if all values of the measured reflection coefficient curve are within the reflection envelope then the specific interconnect structure passes the test, and if one or more values of the measured reflection coefficient curve are not within the reflection envelope then the specific interconnect structure fails the test.

13. The testing device of claim 12 wherein the reflection coefficient signature includes a curve, each point on the curve defining a reflection coefficient value versus time.

14. The testing device of claim 13 wherein one or more portions of the reflection coefficient signature are a non-linear curve.

15. The testing device of claim 12 wherein the measurement module is configured to measure the reflection coefficient using time domain reflectometry.

16. The testing device of claim 12 wherein each specific interconnect structure has a unique reflection coefficient signature.

17. The testing device of claim 12 wherein different portions of the reflection envelope have different tolerances relative to a corresponding portion of the reflection coefficient signature.

18. The testing device of claim 12 wherein the reflection envelope is fine-tuned to match a corresponding shape of the reflection coefficient signature.

19. The testing device of claim 12 wherein the reflection envelope includes an upper limit boundary and a lower limit boundary around the reflection coefficient signature.

20. The testing device of claim 12 wherein the reflection coefficient signature is time-based and the measured reflection coefficient curve is time-based.

* * * * *